(12) United States Patent
Gölzhäuser et al.

(10) Patent No.: US 8,377,243 B2
(45) Date of Patent: Feb. 19, 2013

(54) METHOD FOR TRANSFERRING A NANOLAYER

(76) Inventors: Armin Gölzhäuser, Bielefeld (DE);
Christoph Nottbohm, Bielefeld (DE);
André Beyer, Bielefeld (DE)

( * ) Notice: Subject to any disclaimer, the term of this patent is extended or adjusted under 35 U.S.C. 154(b) by 526 days.

(21) Appl. No.: 12/595,314

(22) PCT Filed: Apr. 11, 2008

(86) PCT No.: PCT/EP2008/002891
§ 371 (c)(1),
(2), (4) Date: Dec. 17, 2009

(87) PCT Pub. No.: WO2008/125302
PCT Pub. Date: Oct. 23, 2008

(65) Prior Publication Data
US 2010/0143726 A1  Jun. 10, 2010

(30) Foreign Application Priority Data
Apr. 11, 2007  (DE) .......................... 10 2007 016 995

(51) Int. Cl.
*B32B 37/14* (2006.01)
*B32B 38/10* (2006.01)
*B32B 43/00* (2006.01)

(52) U.S. Cl. ........ 156/230; 156/234; 156/235; 156/246; 156/249; 156/278; 156/307.1; 977/734; 977/755

(58) Field of Classification Search .................. 156/230, 156/234–236, 239, 246, 247, 249, 272.2, 156/278, 289, 307.1, 307.5, 307.7, 703; 428/446; 977/734, 755, 742, 881
See application file for complete search history.

(56) References Cited

U.S. PATENT DOCUMENTS

| | | | | |
|---|---|---|---|---|
| 6,764,758 B1 * | 7/2004 | Grunze et al. | ................ | 428/336 |
| 7,132,122 B2 * | 11/2006 | Parikh et al. | ................ | 427/2.13 |
| 7,168,365 B2 * | 1/2007 | Trevisan | .................... | 101/33 |
| 7,227,034 B2 * | 6/2007 | Bender et al. | ................ | 562/497 |
| 7,238,456 B2 * | 7/2007 | Bender et al. | .................. | 430/56 |
| 7,510,810 B2 * | 3/2009 | Wu et al. | .................... | 430/60 |
| 7,524,596 B2 * | 4/2009 | Bender et al. | .................. | 430/56 |
| 7,541,483 B2 * | 6/2009 | Goodbrand et al. | .......... | 556/438 |
| 7,665,983 B2 * | 2/2010 | Kendale et al. | ................ | 425/546 |

(Continued)

OTHER PUBLICATIONS

International Search Report for application No. PCT/EP2008/002891; Mailed Feb. 26, 2009; 5 pages.

*Primary Examiner* — Sing P Chan
(74) *Attorney, Agent, or Firm* — Meyertons, Hood, Kivlin, Kowert & Goetzel, P.C.; Eric B. Meyertons

(57) ABSTRACT

The invention relates to a method for transferring a nano-layer (1) from a first substrate (5, 105) to a second substrate (30, 130), wherein the nano-layer (1) comprises a self-aggregating monolayer with cross-linked phenyl units and/or a mono-atomic graphite layer (graphene), wherein the method comprises the following steps:
   a. applying a transfer medium (20, 120) onto nano-layer (1), wherein in this step or afterwards the transfer medium (20, 120) is transformed from a liquid or gaseous phase in a solid phase;
   b. separating the transfer medium (20, 120) and the nano-layer (1) from the first substrate (5, 105); and
   c. applying the transfer medium (20, 120) and the nano-layer (1) onto the second substrate (30, 130); and
   d. removing the transfer medium (20, 120).

13 Claims, 2 Drawing Sheets

U.S. PATENT DOCUMENTS

Figure 1:
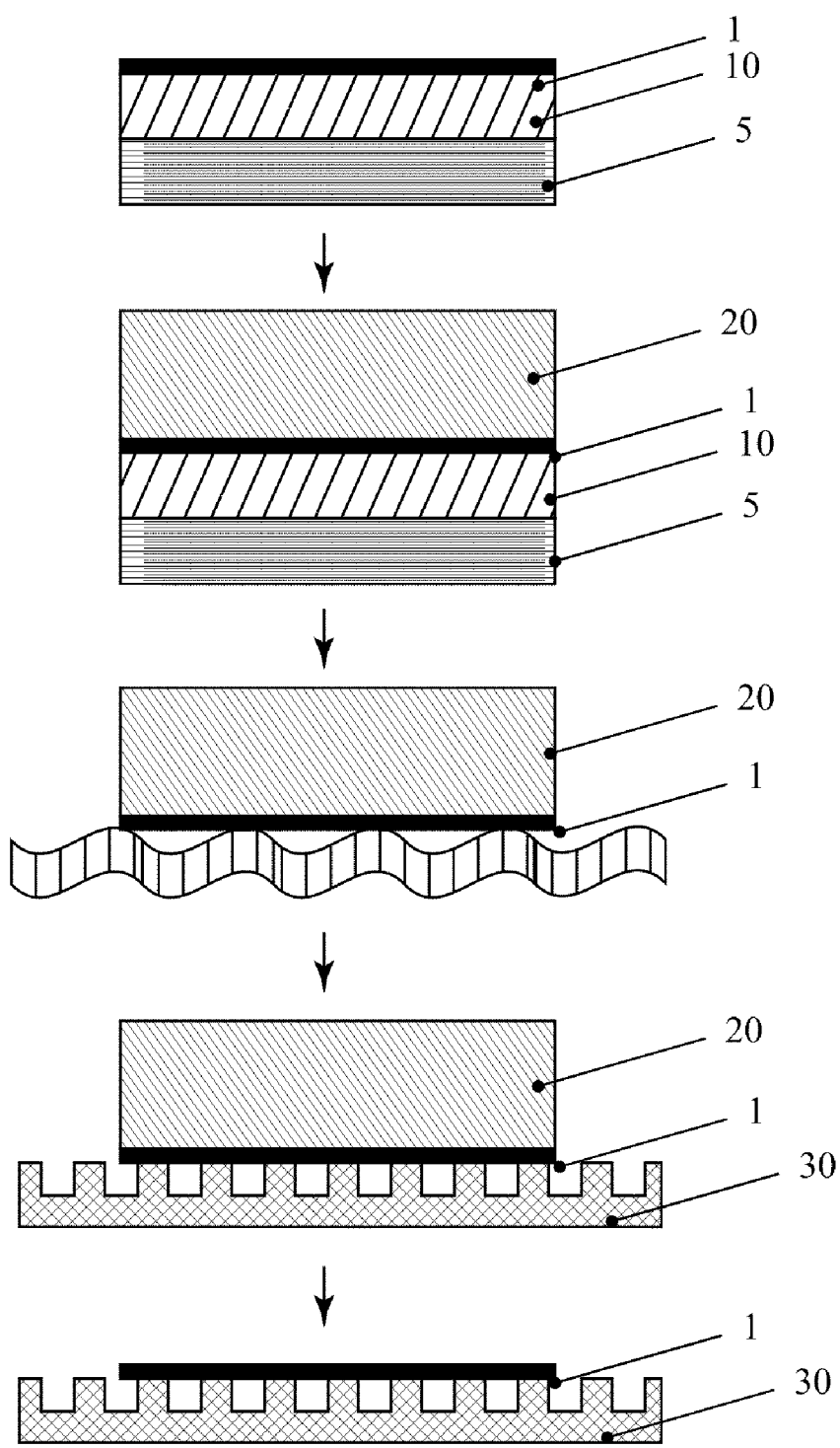

| | | | |
|---|---|---|---|
| 7,744,180 B2* | 6/2010 | Mohri et al. | 347/1 |
| 7,998,651 B2* | 8/2011 | Wuister et al. | 430/269 |
| 8,198,028 B2* | 6/2012 | Rigatti et al. | 435/6.12 |
| 2004/0180147 A1* | 9/2004 | Parikh et al. | 427/558 |
| 2004/0206256 A1* | 10/2004 | Trevisan | 101/153 |
| 2007/0261574 A1* | 11/2007 | Kendale et al. | 101/17 |
| 2010/0022412 A1* | 1/2010 | Rigatti et al. | 506/17 |
| 2011/0266255 A1* | 11/2011 | Wuister et al. | 216/40 |
| 2012/0156599 A1* | 6/2012 | Obata et al. | 430/56 |
| 2012/0172259 A1* | 7/2012 | Rigatti et al. | 506/26 |

* cited by examiner

US 8,377,243 B2

METHOD FOR TRANSFERRING A NANOLAYER

1. TECHNICAL FIELD

The invention relates to a method for transferring a nano-layer from a first substrate to a second substrate as well as a transmission electron microscopy (TEM) substrate covered with a nano-layer using this method.

2. PRIOR ART

The manufacturing and the application of objects with dimensions in the nanometer range are the objectives of nano-technology. For example nano-spheres, nano-wires or also so called "nano-tubes" made of carbon are known. Nano-tubes are an example that objects of the nano-technology can have in one dimension absolutely macroscopic dimensions, while their extents in one or several other directions are limited to the nanometer range.

Nano-layers are a further technically important example. In the following this shall mean a layer of any material having in two directions macroscopic dimensions, i.e. in the micrometer range or above, while the thickness of the layer is limited to at most 10 nm. In doing so, the nano-layer has not to be formed homogeneously, but can be structured, for example with holes, lines, or the like.

Several possibilities for the manufacturing of such nano-layers have been known since a long time, for example with the aid of the known Langmuir-Blodgett technique. A different approach is self-aggregating monolayers of highly ordered organic molecules which are chemisorbed on the substrate surface. For example, the manufacturing of such layers is described in the DE 199 45 935 A1. In addition, nano-layers can also be manufactured from mono-atomic graphite layers which are for example generated by pyrolysis, cf. for example Berger C. et al., Science 312, 1191 (2006), Rolling E, Gweon G H, Zhou S Y, et al., Journal of Physics and Chemistry of Solids 67, 2172 (2006) as well as Hass et al., in Appl. Phys. Lett. 89, 143106 (2006).

However, all of these layers can only obtain a technical relevance if it succeeds to make them in a simple manner manipulable, i.e. to transfer the layer essentially non-destructively from one support (substrate) to another support. The publication "*Freestanding Nanosheets from Crosslinked Biphenyl Self-Assembled Monolayers*" in Adv. Mater. 2005, vol. 17, pages 2583-2587 describes a method in which a nano-layer can be discharged by separation of the binding to the substrate or by dissolving the substrate. However, this still does not enable a controlled transfer onto another substrate. Further, a method is known from the publication of Meitl. et al. in Nature Materials, vol. 5, 2006, p. 32 with which, among other things, thin layers can be transferred from one substrate to another one with the aid of a stamp of polydimethylsiloxane. Since the adhesion between the stamp and the substrate is essentially determined by the velocity with which the stamp is moved relative to the substrate, this method can be technically used only to a limited extent.

The present invention is therefore based on the problem to provide a method with which a nano-layer can be transferred from a first substrate to a second substrate in a simple manner.

3. SUMMARY OF THE INVENTION

This problem is solved according to one aspect of the present invention by a method with the features of patent claim 1. The method comprises the following steps:

a. applying a transfer medium onto the nano-layer, wherein the transfer medium is transformed in this step or afterwards from a liquid or a gaseous phase in a solid phase;
b. separating the transfer medium and the nano-layer from a first substrate; and
c. applying the transfer medium and the nano-layer onto the second substrate; and
d. removing the transfer medium.

Thus, different from the discussed prior art, a phase transition of a transfer medium is used for handling the nano-layer. After the transition in the solid phase, the transfer medium is preferably stable against further process steps but can be dissolved in a further process step, or can be removed from the nano-layer in another manner. For this purpose, the transfer medium can for example comprise a photoresist.

Step b. in the indicated method may comprise dissolving a sacrificial layer arranged between the first substrate and the nano-layer. The sacrificial layer can be any layer which can be removed by suitable chemical or physical methods and thus allowing the separation of the nano-layer from the first substrate. However, it is also basically conceivable to use other approaches to remove the binding between the first substrate and the nano-layer.

In an embodiment the transfer medium dissolved in the step b. and the nano-layer are dipped into a liquid, in particular water, prior to applying onto the second substrate, wherein the transfer medium and the nano-layer preferably float on the liquid surface. The second substrate is preferably dipped into the liquid in step c. so that the transfer medium and the nano-layer can settle onto it. However, the transfer medium and the nano-layer can also at first be applied in a first liquid onto an intermediate substrate and can then again be removed in a second liquid from the intermediate layer.

The described method obtains a particular relevance for the manufacture of substrates for the transmission electron microscopy (TEM). For this purpose, it is advantageous when the second substrate is in particular a TEM grid, onto which the nano-layer is arranged with the explained method. Such a TEM grid has a large number of nano-membranes which secure a high degree of contrast at the transmission electron microscopy from objects arranged onto the nano-membranes.

4. SHORT DESCRIPTION OF THE DRAWINGS

Figure 2:
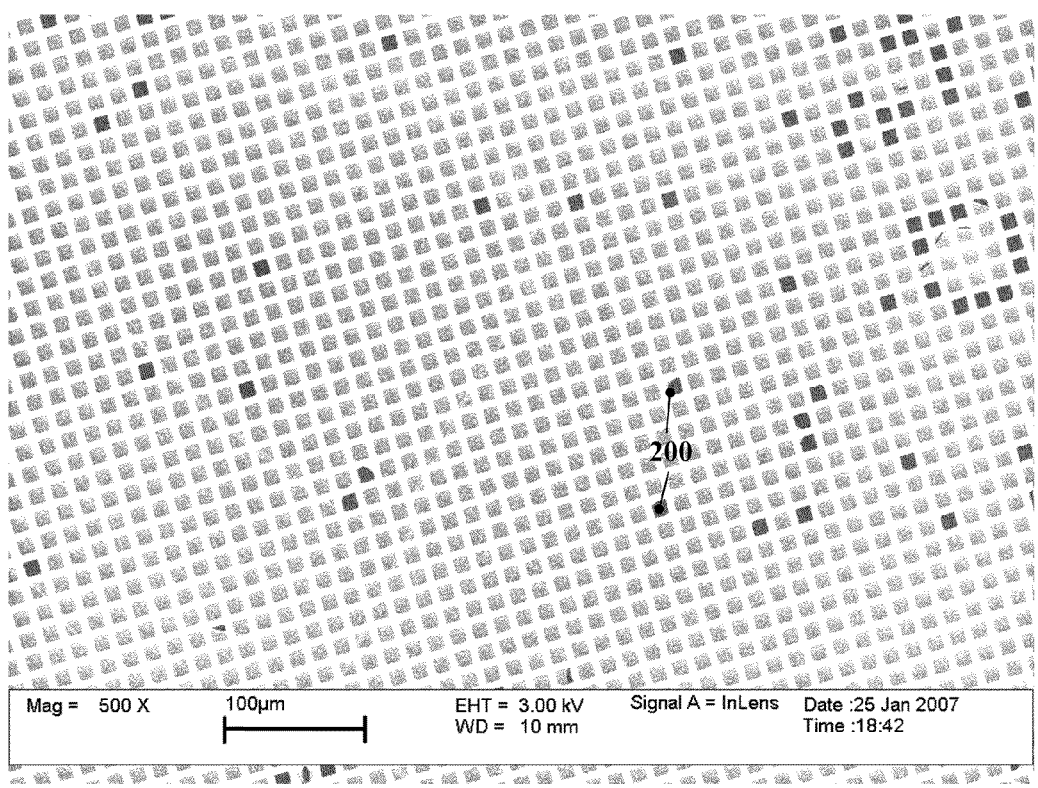
Figure 3:
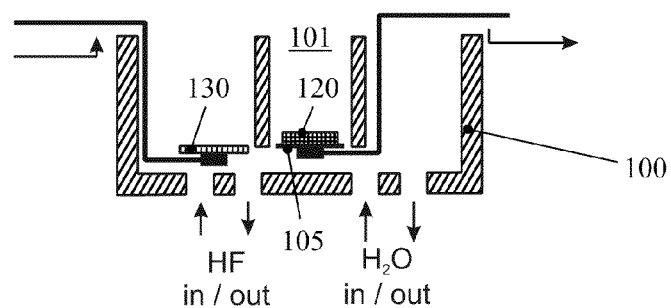

In the following detailed description embodiments of the present invention are explained in more detail with reference to the accompanying Figures. The Figures show:

FIG. 1: a schematic representation of an embodiment of the inventive method;

FIG. 2: a TEM image of an embodiment of a TEM grid according to the present invention, and FIG. 3: a schematic representation of an apparatus for a largely automated execution of an embodiment of the invention.

5. DETAILED DESCRIPTION OF PREFERRED EMBODIMENTS

At first, an embodiment of the present invention is generally explained on the basis of FIG. 1, then concrete realizations of examples 1-4 are explained in more detail. With the described method any nano-layers can be removed from any carrier substrate and can be transferred to any other surface.

As can be seen in FIG. 1, a nano-layer 1 arranged on a substrate 5 is the starting point for the explained method. An intermediate layer is between the substrate 5 and the nano-layer 1 which is dissolved in the cause of the process and is therefore named as sacrificial layer 10. It has to be considered that the representation in FIG. 1 is schematic and that the thickness of the nano-layer is strongly exaggerated in comparison to the thickness of the other layers. As already mentioned in the introductory part, the nano-layer 1 can be arranged onto the substrate 5 and the sacrificial layer 10 using a number of techniques. Furthermore, it is conceivable that the nano-layer can be structured in a desired manner by photolithographic processing or other methods. Furthermore, it is possible to functionalize the nano-layer chemically prior to the transfer, for example for later biological applications.

The substrate 5 can be a surface which is particularly well suited for the preparation of the nano-layer, for example a surface of Au, Ag, Si, $Si_3N_4$, $SiO_2$, Fe, or also other suitable substrate materials. However, the starting condition of FIG. 1 may also be obtained by different previous method steps.

In the first step of the method represented in FIG. 1, the transfer medium 20 is applied to the carrier substrate 5 with the sacrificial layer 10 and the nano-layer 1. In the embodiment of FIG. 1, the transfer medium 20 is initially liquid or gaseous. When being arranged on the nano-layer 1 or immediately after this step, it is transformed in the solid phase.

In the next step the sacrificial layer 10 is dissolved, for example by suitable solvent or different chemical or physical approaches. Thus, the nano-layer 1 is separated from the carrier substrate 5. The mechanical stability of nano-layer 1 in this condition is guaranteed by the transfer medium 20. However, it is absolutely possible to not only apply a single transfer medium 20 which guaranties the mechanical stability, but several layers or even a suitable layer system, for example at first an adhesive and then a particular stable material layer (not shown in FIG. 1).

It is also possible to do without a sacrificial layer and to effect the separation of the nano-layer from the carrier substrate by a different method. For example, chemical bonds between the nano-layer and the carrier substrate can be broken-up by a suitable (for example gaseous) reacting agent.

In the next step the transfer medium 20 with the nano-layer 1 is transferred to the target substrate 30 (or an intermediate substrate, not shown in FIG. 1). This process step is facilitated by the enhanced mechanical stability and the size of the transfer medium 20 compared to the transfer with a pure nano-layer 1, or is enabled in the first place, respectively. In the last step of the embodiment of FIG. 1, the transfer medium 20 is finally removed, for example by dissolving it.

In the following concrete examples of nano-layers are described which are transferred from a substrate to another one with the explained method.

Example 1

Transfer of a cross-linked monolayer of 4'-[(3-trimethoxysilyl) proproxy]-[1,1'-biphenyl]-4-carbonitril (in the following monolayer (I)) to a TEM grid. Such a monolayer has significant advantages for electron microscopy. The layer thickness is given by the length of the monomers from which the monolayer is formed. Therefore, it is to a large extent homogenous and is approximately 1.5 nm. Compared to this, conventional TEM substrates are significantly thicker leading to a less sample contrast in the TEM image. Chemical nano-lithography can be executed on the monolayer (I), cf. Biebricher A. et al.; Journal of Biotechnology 112, 97, (2004). With it, for example organic molecules can be bound on well defined positions onto the monolayer (I).

For the manufacture of the coated TEM grid the monolayer (I) is at first prepared on a silicon substrate coated with silicon nitride. The silicon is used in this example as carrier substrate; the silicon nitride layer serves as a sacrificial layer and the monolayer (I) is the nano-layer to be transferred. A photoresist is use as transfer medium (for example AR-P 3510 of Allresist GmbH, www.allresist.de). The resist is dashed onto the carrier substrate and hardened on a heating plate. A subsequent treatment with hydrofluoric acid (48%) dissolves the sacrificial layer, i.e. the silicon nitride. Thus, the photoresist with the monolayer (I) lies only loosely on the silicon. By carefully extracting and re-dipping (preferably into water) the photoresist detaches from the silicon and floats on the liquid surface. Subsequently, a TEM grid is used as target substrate and is dipped into the water with a tweezers. The floating photoresist "is fished-out" with the target substrate. In the last step, the photoresist is dissolved in acetone (fourth step).

FIG. 2 shows a TEM grid (1500 mesh Au grid) with a monolayer (I) stretched above it. The transferable area is only limited by the size of the grid. It can be recognized that the monolayer has only defects 200 at a few positions (which appear darker in the image).

By the described transfer of the monolayer (I) to standard TEM grids (for example Quantifoil grids of Quantifoil Micro Tools GmbH, www.quantifoil.com) in one step more than 10,000 membranes can be generated on one TEM grid which are sufficiently stable. The size of the individual membrane areas can simply be varied by using different TEM grids. Since the TEM grids are comparatively low priced, the explained method allows in a cost effective way manufacturing of TEM substrates for high sample contrast.

In the TEM application such TEM grids having a nano-layer are beneficial compared with TEM grids coated with carbon, both with respect to their mechanical stability as well as the capability to withstand electron beams with energies of up to 200 keV. A further advantage is the low background contrast during the trans-mission electron microscopy with high resolution.

The method proposed in the first example can be adjusted with relative simple means to an automated production. For this purpose, the system schematically represented in FIG. 2 can be used, for example. It concerns a hydrofluoric acid resistant bin 100 having several chambers and inlets or outlets, respectively for water and hydrofluoric acid. The actual etching chamber 101 is dimensioned in such a manner that its footprint is only slightly larger than the footprint of the carrier substrate 105. Thus, the location of the floating photoresist is sufficiently defined.

The overall transfer process can be performed with this set-up as follows:

In the first step, the photoresist 120 is applied to the carrier substrate 105 as already explained. In the second step, the sample is positioned in the bin, as shown in FIG. 3. The hydrofluoric acid is introduced and thus the sacrificial layer (not represented in FIG. 3) is dissolved. The hydrofluoric acid is drained and immediately afterwards the bin is filled with water. In doing so, the photoresist detaches from the silicon and floats on the water surface. The silicon sample can now be removed and the target substrate 130 can be positioned. After the target subject has taken the same location as the carrier substrate (not represented in FIG. 3), the water can again be drained. Finally, the photo resist has to be dissolved, for example with acetone.

Example 2

Transfer of a Structured Monolayer (I) to a Gold Substrate

Nano-layers with self-aggregating monolayers (SAM) can be prepared on a number of substrates. For this purpose, a suitable SAM substrate combination has to be known. For example, the monolayer can be used as resist for wet chemical etching or for metal deposition. Furthermore, (bio-)molecules can be coupled by "chemical lithography".

However, for a given substrate a suitable molecule is not always available to generate monolayers. In particular, a lot of effort is necessary to obtain a new SAM substrate combination and to characterize it. For lithographical processes it is in addition generally necessary that the substrate is plain.

With the inventive transfer of monolayers it is however possible to use known SAM substrate combinations the previous lithographical structuring can be made on a flat substrate. The transfer can then occur to curved surfaces as well as on substrates on which no SAM can be formed.

Example 2 is executed as follows: the monolayer (I) is prepared on a silicon substrate coated with silicon nitride and is structured with photo-lithographical methods (spinning of photoresist, exposure to light, developing, treatment with oxygen plasma, dissolving of the photoresist). Alternatively, the structuring can also be performed by electron lithography. The further process steps are described in example 1. Instead of a TEM grid, however a gold surface is used as target substrate and is dipped with a tweezers into water. The floating photoresist is "fished-out" with the target substrate. Finally, the photoresist is dissolved in acetone.

Using the approach according to the second example a (structured) monolayer (I) can be prepared on gold substrates, which is not possible without the explained transfer process.

Example 3

Transfer of a 1,1'-biphenyl-4-thiol monolayer (in the following monolayer (II)) to a silicon oxide substrate In this example, the monolayer (II) is at first prepared on mica coated with gold. The mica serves as carrier substrate, the gold serves as sacrificial layer and the monolayer (II) is the monolayer to be transferred. As transfer medium a photoresists is used (for example AR-P 3510 of Allresist GmbH, www.allresist.de). The resist is spun onto the carrier substrate and hardened on a heating plate.

In the next step, the mica substrate is striped layer by layer with a tape (for example Scotch tape of 3M); alternatively it can be dissolved in hydrofluoric acid. Afterwards, the gold (sacrificial layer) is removed (for example with an iodine/potassium iodide solution or potassium cyanide solution) by allowing the sample to float on the etching solution. With a tweezers a silicon oxide sample can now be dipped into the solution, and thus the monolayer (II) with the photoresist can be "fished-out". Optionally, prior to this the monolayer (II) with the photoresist can be "fished-out" from the etching solution with an auxiliary substrate and can be dipped into water so that the transfer to the target substrate has not be done from the etching solution. Finally, also here the photoresist is dissolved in acetone. In this example, it is also the advantage that the specific monolayer (II) can not be prepared on silicon oxide substrates without using the described method.

Example 4

Transfer of Graphene (Mono-Atomic Graphite Layer) onto a TEM Sample Carrier

Free-standing graphene layers have been prepared by Geim et al. (Meyer et al., Nature 2007 (446) 60). For this purpose, a suitable piece of graphene is selected by means of optical control and then a metal grid is arranged thereon by means of electron lithography. The substrate is then dissolved so that the metal lattice with the graphene remains. However, the structuring with electron beam lithography and the subsequent applying of metal is procedurally very sophisticated and in particular not feasible for large areas.

With the method described in example 1, graphene can also be transferred in large areas. For this purpose, a graphene layer manufactured by pyrolysis on SiC could be used as starting material. The SiC serves here also both, as carrier layer and sacrificial layer. After applying the transfer medium (for example a photoresist) the SiC is dissolved by photo-electro chemical etching in hydrofluoric acid (see M. Köhler, "Ätzverfahren für die Mikrotechnik" ("Etching method for micro-technique") WILEY-VCH publisher, Weinheim, 1998 ISBN 3-527-28869-4, p. 331). For this etching method, etching rates are possible up to 1.7 μm/s. Subsequently, the transfer medium with the nano-layer can be transferred with the aid of an intermediate substrate (for example silicon) from the hydrofluoric acid etching solution to a water surface. The further steps are executed analogue to example 1.

Example 5

Manufacture of Nano-Electro-Mechanical Systems (NEMS)

The monolayer (I) can also be transferred with the method described in example 1 on a correspondingly prefabricated NEMS structure as active element. With it, for example an acoustic sensor or a nano-microphone, respectively can be fabricated. The advantage of this method is the enhanced compatibility to existing methods for the manufacture of integrated circuits. In the first step, the NEMS carrier chip is manufactured with the corresponding switching circuits. In the second step, the monolayer is transferred. In this process, there are no specific requirements to the durability of the NEMS carrier chips, for example with respect to acids, since the chip is simply exposed to water when transferring the monolayer (I).

The invention claimed is:

1. A method for transferring a nano-layer from a first substrate onto a second substrate, wherein the nano-layer comprises a self-aggregating monolayer with cross-linked phenyl units or a mono-atomic graphite layer (graphene), the method comprising:
    a) applying a transfer medium in a liquid or gaseous phase onto the nano-layer, wherein during application, or afterwards the transfer medium is transformed to a solid phase;
    b) separating the transfer medium and the nano-layer from the first substrate;
    c) applying the transfer medium and the nano-layer onto the second substrate; and
    d) removing the transfer medium.

2. The method according to patent claim 1, wherein step b comprises dissolving a sacrificial layer arranged between the first substrate and the nano-layer.

3. The method according to claim 1, wherein the transfer medium separated in step b and the nano-layer are dipped into water, prior to applying the transfer medium onto the second substrate.

4. The method according to claim 3, wherein the transfer medium and the nano-layer float on the surface of the water.

5. The method according to claim 3, wherein the second substrate is dipped into the water so that the transfer medium and the nano-layer can settle on the second substrate.

6. The method according to claim 1, wherein the transfer medium is removed by dissolving in step d.

7. The method according to claim 1, wherein the transfer medium comprises a photoresist.

8. The method according to claim 1, wherein the nano-layer is structured, prior to step a, by photo-lithographic or electron-lithographic methods.

9. The method according to claim 1, further comprising: applying the transfer medium and the nano-layer onto an intermediate substrate in a first liquid and separating the transfer medium from the intermediate substrate in a second liquid.

10. The method according to claim 1, wherein the nano-layer comprises a self-aggregating monolayer with cross-linked biphenyl or terphenyl units.

11. The method according to claim 1, wherein the nano-layer comprises a mono-atomic graphite layer (graphene) generated by pyrolysis.

12. The method according to claim 1, wherein the second substrate is a substrate for transmission electron microscopy (TEM).

13. A method for transferring a nano-layer from a first substrate onto a second substrate, wherein the nano-layer comprises a self-aggregating monolayer with cross-linked phenyl units and a mono-atomic graphite layer (graphene), the method comprising:
   a) applying a transfer medium in a liquid or gaseous phase onto the nano-layer, wherein during application, or afterwards, the transfer medium is transformed to a solid phase;
   b) separating the transfer medium and the nano-layer from the first substrate;
   c) applying the transfer medium and the nano-layer onto the second substrate; and
   d) removing the transfer medium.

* * * * *

UNITED STATES PATENT AND TRADEMARK OFFICE
CERTIFICATE OF CORRECTION

PATENT NO. : 8,377,243 B2  Page 1 of 1
APPLICATION NO. : 12/595314
DATED : February 19, 2013
INVENTOR(S) : Gölzhäuser et al.

It is certified that error appears in the above-identified patent and that said Letters Patent is hereby corrected as shown below:

On the Title Page

In item (30), delete "10 2007 016 995" and insert --10 2007 016 995.9--.

Signed and Sealed this
Sixteenth Day of April, 2013

Teresa Stanek Rea
*Acting Director of the United States Patent and Trademark Office*